United States Patent [19]

McCollum

[11] Patent Number: 5,789,764

[45] Date of Patent: Aug. 4, 1998

[54] ANTIFUSE WITH IMPROVED ANTIFUSE MATERIAL

[75] Inventor: John L. McCollum, Saratoga, Calif.

[73] Assignee: Actel Corporation, Sunnyvale, Calif.

[21] Appl. No.: 745,096

[22] Filed: Nov. 7, 1996

Related U.S. Application Data

[63] Continuation-in-part of Ser. No. 423,518, Apr. 14, 1995, Pat. No. 5,592,016.

[51] Int. Cl.$^6$ ............................................. H01L 29/00
[52] U.S. Cl. ..................... 257/76; 257/77; 257/529; 257/530; 257/751
[58] Field of Search ...................... 257/530, 529, 257/77, 76, 751

[56] References Cited

U.S. PATENT DOCUMENTS

| 3,675,090 | 7/1972 | Neale ................................ 317/234 |
| 3,717,852 | 2/1973 | Abbas et al. ........................ 340/173 |

(List continued on next page.)

FOREIGN PATENT DOCUMENTS

| 0 323 078 | 7/1989 | European Pat. Off. | ........ H01L 23/52 |
| 0 414 361 | 2/1991 | European Pat. Off. | ........ H01L 23/52 |
| 0 416 903 | 3/1991 | European Pat. Off. | .... H01L 21/3205 |
| 0 436 387 | 7/1991 | European Pat. Off. | ...... H01L 21/311 |
| 0 452 091 | 10/1991 | European Pat. Off. | ...... H01L 23/525 |
| 0 455 414 | 11/1991 | European Pat. Off. | ...... H01L 23/525 |
| 0 500 034 | 8/1992 | European Pat. Off. | ...... H01L 23/525 |
| 0 501 120 | 9/1992 | European Pat. Off. | ..... H01O 23/525 |
| 0 501 687 | 9/1992 | European Pat. Off. | ...... H01L 23/525 |
| 0 529 820 | 3/1993 | European Pat. Off. | ......... H05K 3/00 |
| 0 592 078 | 4/1994 | European Pat. Off. | ........ H01L 21/90 |
| 0 602 836 | 6/1994 | European Pat. Off. | ...... H01L 23/525 |
| 0 661 745 | 7/1995 | European Pat. Off. | ...... H01L 23/525 |
| 0 662 712 | 7/1995 | European Pat. Off. | ...... H01L 23/525 |
| 0 671 767 | 9/1995 | European Pat. Off. | ...... H01L 23/525 |
| 0 684 646 | 11/1995 | European Pat. Off. | ...... H01L 23/525 |
| 60-242678 | 12/1985 | Japan | ...................... H01L 29/78 |
| 04-229635 | 8/1992 | Japan | ...................... H01L 21/82 |
| 06-029396 | 2/1994 | Japan | ...................... H01L 21/82 |
| 06-260558 | 9/1994 | Japan | ...................... H01L 21/82 |
| 06-310604 | 11/1994 | Japan | ...................... H01L 21/82 |
| 87/00969 | 2/1987 | WIPO | ...................... H01L 23/52 |
| 87/02827 | 5/1987 | WIPO | ...................... H01L 27/24 |
| 92/13359 | 8/1992 | WIPO | ..................... H01L 21/285 |
| 92/20109 | 11/1992 | WIPO | ..................... H01L 45/00 |
| 92/21154 | 11/1992 | WIPO | ..................... H01L 45/00 |
| 92/22088 | 12/1992 | WIPO | .................... H01L 21/3205 |
| 93/03499 | 2/1993 | WIPO | ..................... H01L 23/525 |
| 93/05514 | 3/1993 | WIPO | ........................ G11C 17/16 |
| 94/05041 | 3/1994 | WIPO | ..................... H01L 23/525 |
| 96/39717 | 12/1995 | WIPO | ..................... H01L 23/525 |

OTHER PUBLICATIONS

Chiang, "Antifuse Structure Comparison for Field Programmable Gate Arrays", 1992, IEEE, IEDM, pp. 611–614.

Cohen, "A Flat–Aluminum Based Voltage–Programmable Link for Field–Programmable Devices", May 1994, IEEE Translations on Electron Devices, vol. 41, No. 5, pp. 721–724.

Hu, "Interconnect Devices for Field Programmable Gate Array", 1992, IEEE, IEDM, pp. 591–594.

Pauleau, "Interconnect Materials for VLSI Circuits", Apr. 1987, Solid State Technology, vol. 30, No. 4, pp. 155–162.

*Primary Examiner*—William Mintel
*Attorney, Agent, or Firm*—D'Alessandro & Ritchie

[57] ABSTRACT

According to the present invention, an antifuse comprises first and second conductors separated by an antifuse material having a thickness selected to impart a desired target programming voltage to the antifuse. The antifuse material is of SiC and provides a solid material stable at temperatures below about 350° C., a resistivity of greater than about $10^{12}$ ohm-cm. The antifuse material may be applied using chemical vapor deposition (CVD) techniques. Also, the SiC antifuse material of the present invention may take any one of a number of via antifuse and stacked antifuse forms.

11 Claims, 9 Drawing Sheets

U.S. PATENT DOCUMENTS

| | | | |
|---|---|---|---|
| 4,361,599 | 11/1982 | Wourms | 427/90 |
| 4,398,335 | 8/1983 | Lehrer | 29/577 |
| 4,441,247 | 4/1984 | Gargini et al. | 29/571 |
| 4,489,481 | 12/1984 | Jones | 29/591 |
| 4,507,673 | 3/1985 | Aoyama et al. | 357/23 |
| 4,647,340 | 3/1987 | Szluk et al. | 156/662 |
| 4,651,409 | 3/1987 | Ellsworth et al. | 29/576 |
| 4,732,865 | 3/1988 | Evans et al. | 437/12 |
| 4,740,485 | 4/1988 | Sharpe-Geisler | 437/246 |
| 4,748,490 | 5/1988 | Hollingsworth | 357/51 |
| 4,751,197 | 6/1988 | Wills | 437/174 |
| 4,796,075 | 1/1989 | Whitten | 357/51 |
| 4,822,753 | 4/1989 | Pintchovski et al. | 437/192 |
| 4,847,732 | 7/1989 | Stopper et al. | 361/395 |
| 4,899,205 | 2/1990 | Hamdy et al. | 357/51 |
| 4,907,064 | 3/1990 | Yamazaki et al. | 357/54 |
| 4,912,066 | 3/1990 | Wills | 437/173 |
| 4,914,055 | 4/1990 | Gordon et al. | 437/192 |
| 4,920,072 | 4/1990 | Keller et al. | 437/192 |
| 4,943,538 | 7/1990 | Mohsen et al. | 437/52 |
| 4,981,813 | 1/1991 | Bryant et al. | 437/73 |
| 5,010,039 | 4/1991 | Ku et al. | 437/228 |
| 5,070,384 | 12/1991 | McCollum et al. | 357/51 |
| 5,087,589 | 2/1992 | Chapman et al. | 437/195 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,181,096 | 1/1993 | Forouhi | 257/530 |
| 5,196,724 | 3/1993 | Gordon et al. | 257/530 |
| 5,233,217 | 8/1993 | Dixit et al. | 257/530 |
| 5,242,851 | 9/1993 | Choi | 437/49 |
| 5,248,632 | 9/1993 | Tung et al. | 437/195 |
| 5,258,643 | 11/1993 | Cohen | 257/530 |
| 5,266,829 | 11/1993 | Hamdy et al. | 257/530 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,290,734 | 3/1994 | Boardman et al. | 437/195 |
| 5,298,784 | 3/1994 | Gambino et al. | 257/529 |
| 5,300,456 | 4/1994 | Tigelaar et al. | 437/195 |
| 5,308,795 | 5/1994 | Hawley et al. | 437/195 |
| 5,318,924 | 6/1994 | Lin et al. | 437/192 |
| 5,319,238 | 6/1994 | Gordon et al. | 257/530 |
| 5,322,812 | 6/1994 | Dixit et al. | 437/60 |
| 5,381,035 | 1/1995 | Chen et al. | 257/530 |
| 5,412,245 | 5/1995 | Favreau | 257/530 |
| 5,434,432 | 7/1995 | Sprah et al. | 257/50 |
| 5,440,167 | 8/1995 | Iranmanesh | 257/530 |
| 5,447,880 | 9/1995 | Lee et al. | 437/60 |
| 5,449,947 | 9/1995 | Chen et al. | 257/530 |
| 5,464,790 | 11/1995 | Hawley | 437/60 |
| 5,493,146 | 2/1996 | Pramanik et al. | 257/530 |
| 5,493,147 | 2/1996 | Holzworth et al. | 257/530 |
| 5,514,900 | 5/1996 | Iranmanesh | 257/530 |
| 5,521,440 | 5/1996 | Iranmanesh | 257/774 |
| 5,557,136 | 9/1996 | Gordon et al. | 257/530 |
| 5,573,970 | 11/1996 | Pramanik et al. | 437/60 |
| 5,573,971 | 11/1996 | Cleeves | 437/60 |
| 5,581,111 | 12/1996 | Chen | 257/530 |
| 5,592,016 | 1/1997 | Go et al. | 257/530 |
| 5,623,160 | 4/1997 | Liberkowski | 257/621 |
| 5,661,071 | 8/1997 | Chor | 438/530 |
| 5,679,974 | 10/1997 | Shinriki et al. | 257/530 |

ANTIFUSE WITH IMPROVED ANTIFUSE MATERIAL

CROSS-REFERENCE TO RELATED APPLICATION

This application is a continuation-in-part of U.S. patent application Ser. No. 08/423,518 filed Apr. 14, 1995, now U.S. Pat. No. 5,592,016, in the name of inventor John McCollum and commonly assigned herewith.

BACKGROUND OF THE INVENTION

1. Field of the Invention

The present invention relates to user-programmable antifuse elements. More particularly, the present invention relates to antifuses having silicon carbide (SiC) based antifuse material layers.

2. The Prior Art

User-programmable antifuse elements are known in the art. For example, one type of antifuse has an antifuse material disposed between a layer of polysilicon and a metal layer or between a pair of metal conductors which may comprise different metal layers in a multilayer metal semiconductor fabrication process. The latter type of antifuse is referred to as a metal-to-metal antifuse. Such antifuses usually employ a layer of amorphous silicon as the antifuse material, although they may also employ other antifuse materials, such as oxide, nitride, oxide-nitride, nitride-oxide, oxide-nitride-oxide, nitride, -oxide-nitride layers, or combinations of amorphous silicon with thin dielectric materials and/or barrier layers mentioned above. The metal-to-metal antifuse offers the advantage of lower antifuse resistance (on-resistance) after programming. The lower on-resistance of the amorphous silicon metal-to-metal antifuse results from the substitution of metal as the conductive filament element in place of the polysilicon conductive filament of the first type of antifuse.

Examples of antifuses that have been fabricated using one or more oxide or nitride layers as antifuse material layers include U.S. Pat. No. 4,543,594 to Mohsen et al., U.S. Pat. No. 4,823,181 to Mohsen et al., U.S. Pat. No. 4,899,205 to Hamdy et al. Examples of antifuses that have been fabricated using amorphous silicon as an antifuse material layer, either by itself, or in combination with one or more oxide or nitride layers include U.S. Pat. No. 5,070,384 to McCollum et al., U.S. Pat. No. 5,171,715 to Husher et al., and U.S. Pat. No. 5,181,096 to Forouhi et al., U.S. Pat. No. 5,272,101 to Forouhi et al., and U.S. Pat. No. 5,196,724 to Gordon.

When one or more voltage pulses are applied to program an antifuse, the electric field is chosen to be above the breakdown voltage of the antifuse. The antifuse can change its state from a non-conducting (off) state, where its resistance is in the range of 1 Gohm, to a conducting (on) state where its resistance is less than 1 Mohm and typically in the range of tens of ohms to thousands of ohms. A conductive filament is formed between two conductors.

It is well known in the literature that amorphous silicon antifuses can exhibit switching (read-disturb) behavior, namely the undesired changing of the antifuse from its programmed state back to its unprogrammed state. It has been observed that metal-to-metal amorphous silicon antifuses used in field programmable gate arrays exhibit this read-disturb problem. During operation, as current is passed through the programmed antifuse, its on resistance will be "disturbed" such that it will either increase until the resistance is such that the circuit functionality is affected, or will eventually result in an open-circuit condition.

The read disturb problems of metal-to-metal antifuses and antifuses employing at least one metal conductor are generally not observed in the diffusion/ONO/polysilicon type antifuse. The present inventors have observed from presently-available data that the metal/dielectric/metal antifuses, as well as metal/amorphous silicon/metal antifuses also exhibit a similar read-disturb problem.

The present inventors have observed that by applying a DC current of either polarity having a magnitude equal to 50% or more of the original programming current level across the metal-amorphous silicon-metal antifuse, the antifuse will revert to its off state through the destruction of the conductive filament. Also, the present inventors have observed that by applying a DC current of either polarity having a magnitude equal to 100% or more of the original programming current level across the metal-dielectric-metal antifuse, the antifuse will revert to its off state through the destruction of the conductive filament. While the on resistance of a positively programmed antifuse can be disturbed by a positive DC voltage stress, the disturb probability is much higher for the reverse DC stressed antifuse. In addition, when the operation temperature is raised, the probability of read disturb also increases. This problem severely limits the operating conditions of the metal-to-metal antifuse and thus restricts design flexibility.

There are several ways to reduce this problem. One programming method which helps to solve this problem comprises increasing the programming current or programming voltage. The result is that the antifuse operating current is at a level which is much less than the programming current. With high programming current or programming voltage, more power is generated during formation of the conductive filament, resulting in a filament having a larger diameter. Such a filament will have higher electromigration resistance and is less likely to be disturbed. In addition, since the operating current will be lower in comparison to the programming current, it adds to the electromigration immunity by providing lower current density through the programmed antifuse, resulting in no phase change or major material transport inside the conductive filament.

However, this approach has built-in penalties. Larger transistors are required to provide the higher programming current or programming voltage. This impacts the die size. In addition, lower operating current to prevent read disturb reduces the speed of the product. Neither of these alternatives are optimal or desirable.

Another approach is to add series impedance to the antifuse, limiting the maximum current peak. This reduces the speed enhancing ability of the programmed antifuse as the advantage of the sub-100 ohm fuse is overcome by the series impedance. Consequently, to avoid a reduction in the available speed, a programming current of typically 25 mA or greater is used to minimize the increase delay added by the read disturb effect.

Another approach to minimizing read disturb is to reduce the thickness of the antifuse material disposed between the antifuse conductors. By reducing the thickness of this layer, a larger conductive filament can be created with the same programming voltage. By supplying the same power to create a conductive filament, an antifuse with larger thickness will have a relatively smaller conductive filament diameter. During operation, such an antifuse will have higher operation current density and is thus more likely to be disturbed due to electromigration of material from the conductive filament. However, tradeoffs are required when providing a thinner antifuse material layer. Assuming use of the same composition of the antifuse material layer, a thinner antifuse material layer will result in lower breakdown voltage, higher leakage current, and increased capacitance. Its use may thus not be desirable since it impacts functionality and reliability.

Another way to overcome this problem is to change the composition of the antifuse material. For example, an amorphous silicon antifuse layer may be replaced with a low-temperature dielectric. Dielectric materials, such as oxide, nitride, or combinations of oxide and nitride have lower leakage current and higher breakdown voltage. Therefore, to maintain the same breakdown voltage requirements, the thickness of the antifuse dielectric has to be reduced. However, reducing the thickness of the antifuse material layer results in an increase in the capacitance of the antifuse in its unprogrammed state. This increased capacitance has a negative impact on the product speed.

Despite the existence of the above types of antifuse material layers, there remains room for improvement in reducing the above read disturb problem in antifuses using amorphous silicon.

Thus, it is an object of this invention to provide an antifuse that is harder and denser than the prior art antifuse material layers such as silicon, providing a stronger antifuse that is more resilient to the switching phenomena described above.

It is another object of the present invention to reduce the read disturb phenomenon observed in antifuses having at least one metal conductor in a manner which does not require either reducing antifuse thickness, or increasing the programming current.

It is another object of this invention to provide an antifuse having as many different structures and in conjunction with other materials as have been proposed for amorphous silicon, while employing common deposition techniques known in the industry.

It is further object of this invention to provide high resistance during the off-state, low and predictable fuse resistance, while having low current and low voltage programming requirements and fast programming.

BRIEF DESCRIPTION OF THE INVENTION

According to a first embodiment of the present invention, an antifuse comprises first and second conductors separated by an antifuse material having a thickness selected to impart a desired target programming voltage to the antifuse. The antifuse material is SiC and provides a solid material stable at temperatures below about 350° C. and has a resistivity of greater than about $10^{12}$ ohm-cm. The deposition techniques are known in the industry. For example, according to the presently preferred embodiment of the present invention, the antifuse material is applied using chemical vapor deposition (CVD) techniques. Also, the SiC antifuse material of the present invention may take any one of a number of via antifuse and stacked antifuse forms.

In a second antifuse according to the present invention, an interlayer dielectric is formed over a lower antifuse conductor. An antifuse via is formed in the interlayer dielectric and, an antifuse material layer according to the present invention is formed in the antifuse via by CVD deposition techniques. An upper antifuse conductor is then formed.

In a third antifuse according to the present invention, a lower antifuse conductor is formed, and an interlayer dielectric is formed over the lower antifuse conductor. An antifuse via is formed in the interlayer dielectric and a conductive plug is formed in the antifuse via and planarized with the upper surface of the interlayer dielectric using known techniques. An antifuse layer is then applied using CVD techniques. An upper conductor is then formed over the antifuse layer and the upper conductor and antifuse layers are defined using known etching techniques, such as plasma etching.

In a fourth antifuse according to the present invention, a lower antifuse conductor is formed, and an interlayer dielectric is formed over the lower antifuse conductor. An antifuse via is formed in the interlayer dielectric and a conductive plug is formed in the antifuse via and planarized with the upper surface of the interlayer dielectric using known techniques. An antifuse layer is then applied using CVD techniques. A barrier layer is formed over the antifuse layer. An upper conductor is then formed over the barrier layer. The upper conductor, barrier layer, and antifuse layer are then defined using known etching techniques.

In a fifth antifuse according to the present invention, a lower antifuse conductor is formed and a barrier layer is formed over the lower antifuse conductor. An antifuse layer is then applied using CVD techniques and is defined using known etching techniques. An interlayer dielectric is formed over the antifuse layer. An antifuse via is formed in the interlayer dielectric and a conductive plug is formed in the antifuse via. An upper conductor is then formed over the plug.

In a sixth antifuse according to the present invention, a lower antifuse conductor is formed and a first barrier layer is formed over the lower antifuse conductor. An antifuse layer is then applied using CVD techniques and a second barrier layer is formed over the antifuse layer. This composite layer is defined using known etching techniques. An interlayer dielectric is formed over the second barrier layer. An antifuse via is formed in the interlayer dielectric and a conductive (i.e., tungsten) plug is formed in the antifuse via and an upper conductor is then formed over the plug.

In a seventh antifuse according to the present invention, a lower antifuse conductor is formed, and an interlayer dielectric is formed over the lower antifuse conductor. An antifuse via is formed in the interlayer dielectric and a conductive plug is formed in the antifuse via and planarized with the upper surface of the interlayer dielectric using known techniques. An extra over-etch is performed on the interlayer dielectric exposing the conductive plug, which protrudes from the interlayer dielectric by over 100 nm. Then an antifuse layer is applied using CVD techniques. Subsequently a barrier layer is formed over the antifuse layer. Known patterning techniques are used to define the barrier layer and the antifuse layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to a first embodiment of the present invention, an antifuse comprises first and second conductors separated by an antifuse material composed of silicon carbide (SiC). SiC provides an improvement over amorphous silicon because the addition of carbon to the silicon matrix provides a harder and denser material than silicon, providing a stronger and more read-disturb resistant antifuse, while remaining compatible with the different antifuse structures and materials suitable for use with silicon material based antifuses. SiC antifuses can be used in structures very similar to amorphous silicon since both materials share similar values for the dielectric constant and leakage, and breakdown voltage.

The carbon to silicon ratio (stoichiometry) can be varied over a wide range in order to vary the antifuse characteristics. However, this flexibility in stoichiometry range is bounded by two primary constraints: minimizing the read-disturb effect; and providing for an antifuse material that can withstand fabrication constraints such as heat without suffering from premature and unwanted programming of the antifuse material. Having much less carbon than silicon results in an antifuse material that reacts more like silicon, resulting in an undesirable read disturb effect, whereas, having much less silicon than carbon results in an antifuse material that reacts like amorphous carbon, resulting in an antifuse that exhibits no read-disturb effect since it reduces to graphite which is a conductor. However, too much amorphous carbon results in a SiC material that converts to graphite at a temperature of about 250° C. and exhibits a read-disturb effect that will switch antifuse elements to the on-state during fabrication since fabrication temperatures typically reach higher temperatures.

The ideal stoichiometry range envisioned by the present invention eliminates the read-disturb effect by reducing the antifuse material to graphite forms during programming while avoiding premature programming during the manufacturing process such as withstanding temperatures up to about 350° C. Thus, for a targeted programming voltage of about 10.5 volts, the preferred embodiment of the present invention includes an antifuse material that has a carbon to silicon ratio of between about 1:1 and about 1:100 and that has a thickness between 500 to 1500 angstroms.

Figure 1:
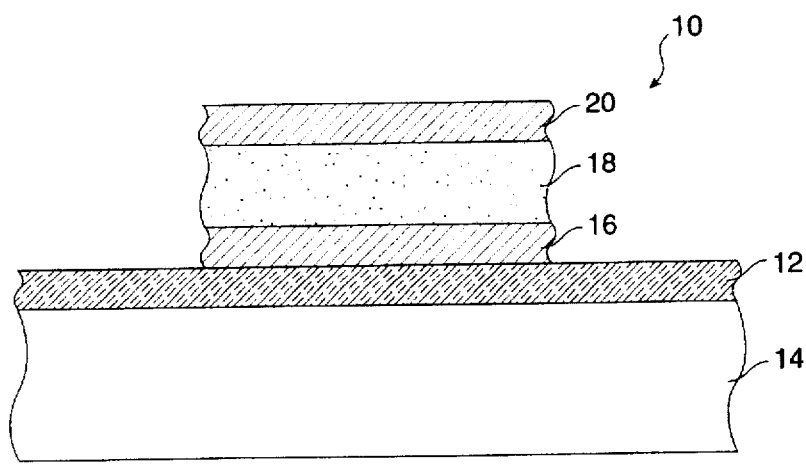
FIG. 1 is a cross-sectional view generally showing an antifuse according to a first embodiment of the present invention.

Referring first to FIG. 1, a generalized antifuse 10 according to the first embodiment of the present invention is shown in cross-sectional view. Antifuse 10 is fabricated over an insulating layer 12 disposed above a semiconductor substrate 14 as shown in FIG. 1. Persons of ordinary skill in the art will recognize that although FIG. 1 shows insulating layer 12 to be disposed immediately in contact with substrate 14, other intervening layers may be present depending on the nature of the integrated circuit with which antifuse 10 is used.

A first or lower conductive conductor 16 is disposed on the upper surface of insulating layer 12. First conductive conductor 16 may be formed from metals, such as those known for use in the formation of metal interconnect layers in integrated circuits. Examples of materials to use for first conductive conductor 16 include, but are not limited to aluminum, silicon, copper, titanium, tungsten, and their alloys or nitrides.

A layer of antifuse material 18 is disposed on the upper surface of first conductive conductor 16. In the presently preferred embodiment of the present invention, the layer of antifuse material 18 is SiC and is configured to provide a breakdown voltage of about 10.5 volts.

The antifuse material may be applied using chemical vapor deposition (CVD) techniques, such as described in Zhang et al., *Parylene-N ILD Properties Under Different Deposition Pressures*, Feb. 21–22, 1995 DUMIC Conference, 1995ISMIC-101D/95/0290.

A second conductive conductor 20 is disposed over the upper surface of the layer of antifuse material 18 to complete the antifuse 10 structure of the present invention. Persons of ordinary skill in the art will understand that first and second conductive conductors 16 and 20 may likely comprise portions of metal layers otherwise used to form interconnects between elements on the integrated circuit containing antifuse 10.

Those of ordinary skill in the art will also appreciate that, while not shown in the figures herein, conventional steps will be employed to form contacts and passivation layers to complete an integrated circuit containing the antifuses of the present invention. These steps and structures are not shown or described herein to avoid overcomplicating the disclosure and thus obscuring the disclosure of the subject matter of the present invention.

As previously noted, the SiC antifuse material of the present invention may be configured in any one of numerous via-antifuse and stacked-antifuse forms. Depending on the form of the antifuse, one or more methods for applying the antifuse layer to the structure may be employed.

Figure 2:
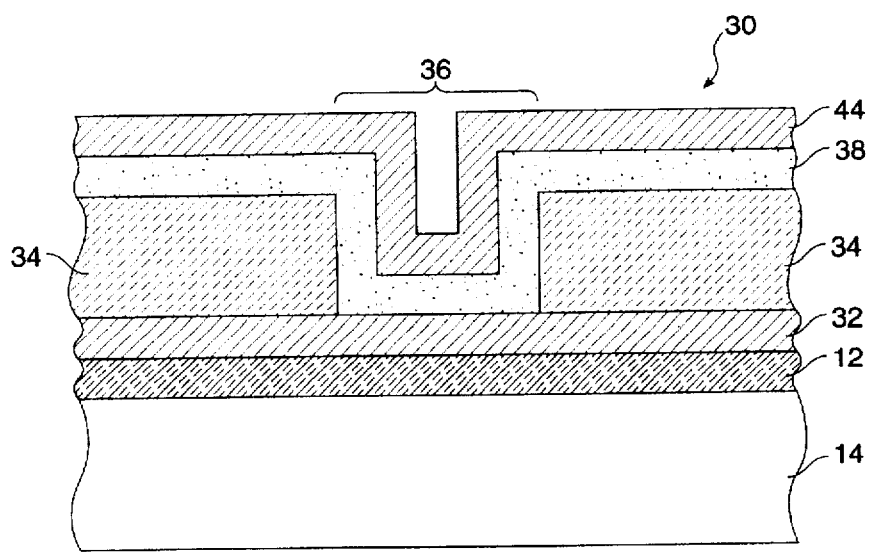
FIG. 2 is a cross-sectional view of an antifuse according to a second embodiment of the present invention.

FIG. 2 is a cross-sectional view of an antifuse according to the second embodiment of the present invention. The antifuse 30 of FIG. 2 is formed in a via in an interlayer dielectric (ILD) layer as is known in the art. Thus, antifuse 30 is shown formed over an insulating layer 12 formed over substrate 14. Those of ordinary skill in the art will recognize that if substrate 14 is non-conductive, insulating layer 12 may not be necessary absent any need for adhesion promotion.

Antifuse 30 comprises a first conductor 32 disposed on the surface of insulating layer 14. First conductor 32 may comprise a metal layer or a metal layer covered with a barrier layer as is known in the art. An ILD layer 34 is disposed over the upper surface of first conductor 32 and has an antifuse via 36 formed therein to expose the upper surface of first conductor 32. A layer of antifuse material 38 is disposed in antifuse via 36 and a second conductor 44 is disposed over the antifuse material layer that typically extends across at least a portion of the upper surface of the ILD layer 34.

Figure 3A:
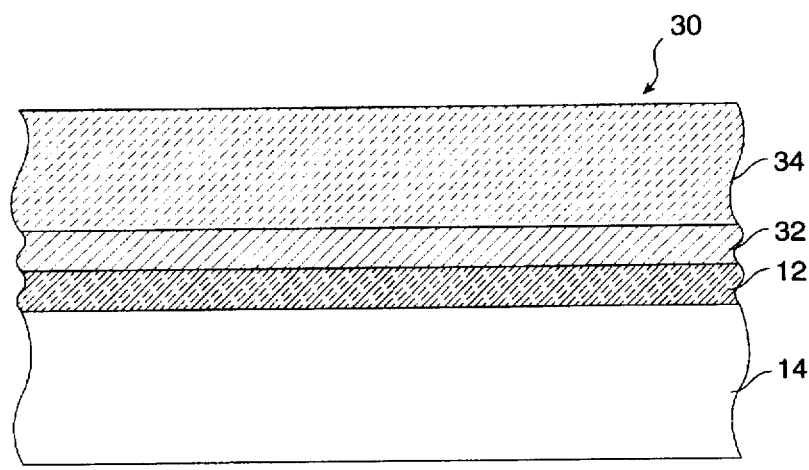
FIGS. 3a–3c are cross-sectional views of the antifuse of FIG. 2 after the completion of selected steps during its fabrication.
Figure 3B:
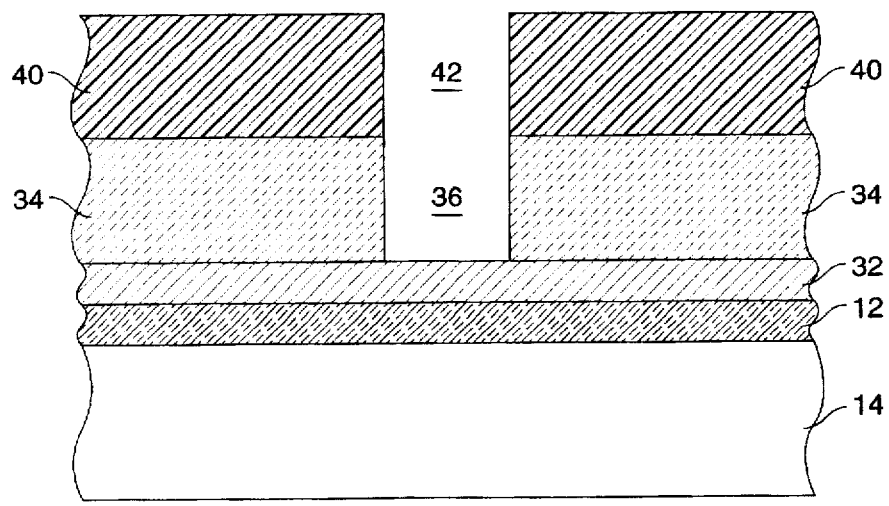
Figure 3C:
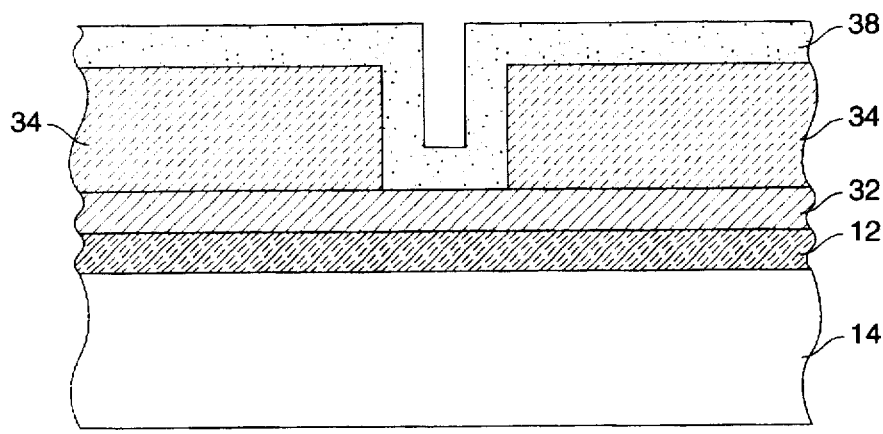

FIGS. 3a–3c are cross-sectional views of the antifuse of FIG. 2 after the completion of selected steps during its fabrication. Referring now to FIG. 3a, antifuse 30 is shown after formation of the first conductor 32 and ILD layer 34 over insulating layer 12 on substrate 14. First conductor 32 may be formed using deposition techniques, as is known in the art, and ILD layer 34 may comprise an oxide of silicon formed using CVD techniques or thermal oxidation.

As may be seen from FIG. 3b, a photomask layer 40 is placed over the ILD layer 34 using conventional photolithography techniques. An etching step is performed to form antifuse via 36 in the aperture 42 of photomask layer 40, either using a wet etch or a plasma etch step as is known in the art. FIG. 3b shows the structure resulting after the etch step has been completed to expose the upper surface of the first conductor 32 in the bottom of antifuse via 36.

Referring now to FIG. 3c, the photomask layer 40 has been removed and a layer of antifuse material 38 has been formed in antifuse via 36. According to this aspect of the present invention, CVD techniques are employed to deposit the antifuse material 38 into antifuse via 36. FIG. 3c shows the structure resulting after the completion of this step.

Finally, the second conductor 44 is formed over the upper surfaces of the ILD 34 and the antifuse material 38 in the antifuse via 36 using commonly-used deposition techniques. The completed structure is shown in FIG. 2.

Several embodiments of the present invention utilize plug technology, wherein a plug formed from a material such as tungsten is used to fill a via, allowing the antifuse material to be applied as a planar layer in a stacked antifuse structure. In such embodiments of the present invention, CVD techniques may be used to apply the antifuse material.

Figure 4:
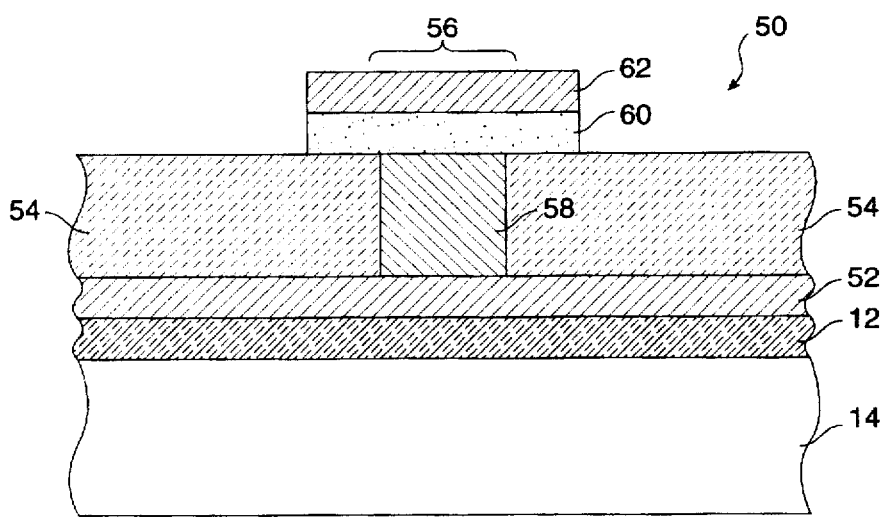
FIG. 4 is a cross-sectional view of an antifuse according to a third embodiment of the present invention.
Figure 5A:
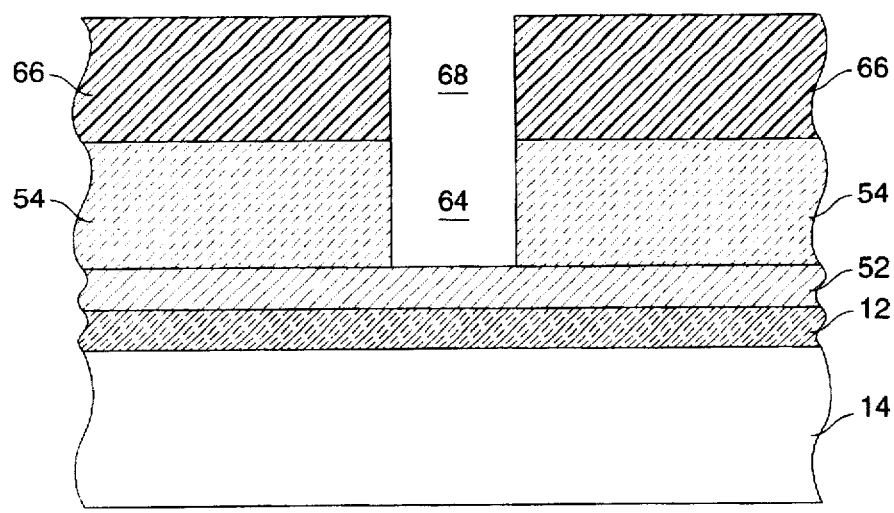
FIGS. 5a–5c are cross-sectional views of the antifuse of FIG. 4 after the completion of selected steps during its fabrication.
Figure 5B:
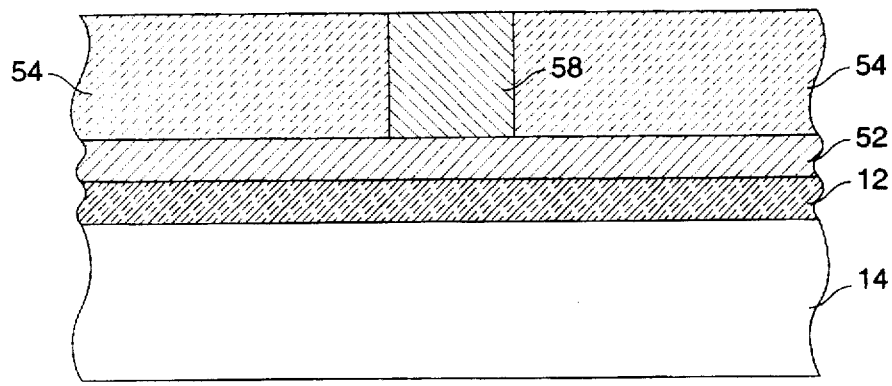
Figure 5C:
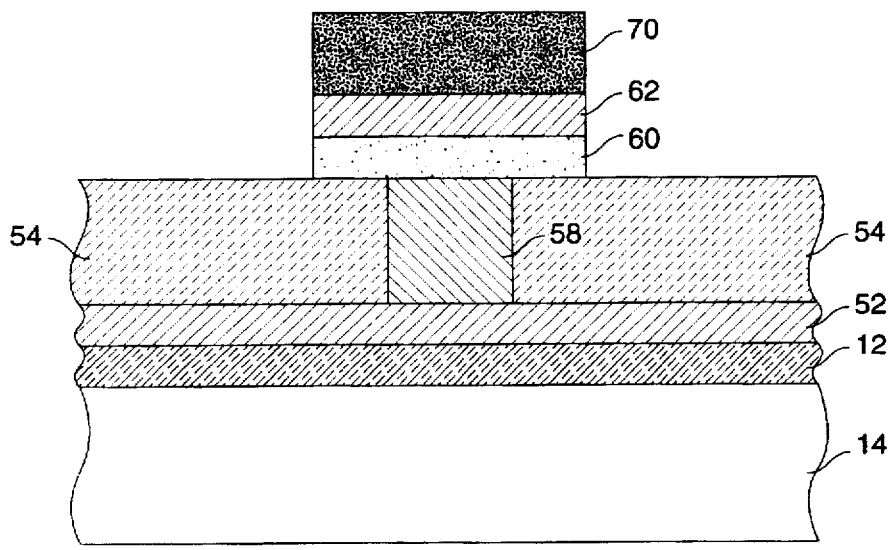

FIG. 4 is a cross-sectional view of an antifuse 50 according to the third embodiment of the present invention, and FIGS. 5a–5c are cross-sectional views of the antifuse 50 of FIG. 4 after the completion of selected steps during its fabrication.

As may be seen from FIG. 4, antifuse 50 is formed over an insulating layer 12 (typically an oxide) disposed on (or over one or more layers above) the surface of substrate 14. A first conductor 52, typically formed from the materials previously disclosed herein, is disposed on the upper surface of the insulating layer 12. An ILD layer 54, which may be formed from deposited oxide, is disposed on the upper surface of first conductor 52. An aperture 56 is formed in the ILD layer 54 and is filled with a plug 58, typically formed from a material such as tungsten. The upper surfaces of the plug 58 and the ILD 54 are substantially planar. A layer of SiC antifuse material 60 according to the present invention is disposed over the upper surfaces of the plug 58 and the ILD 54. A second conductor 62 is disposed on the upper surface of the layer of SiC antifuse material 60.

The fabrication steps used to form antifuse 50 may be seen with reference to FIGS. 5a–5c, cross-sectional views of the antifuse 50 of FIG. 4 after the completion of selected steps during its fabrication, to which attention is now drawn with reference initially to FIG. 5a. First, the lower or first conductor 52, typically formed from aluminum or titanium using sputtering techniques, is deposited on the upper surface of insulating layer 12. An etching step may be employed as is well known in the art to define the layer from which first conductor 52 is formed into various interconnect conductors and antifuse conductors.

Next, the ILD layer 54 is formed on the upper surface of first conductor 52 from a material such as silicon dioxide. A conventional masking step is performed to apply photomask 66 having opening 68 therein and a conventional etching step is performed to form antifuse aperture 64. FIG. 5a shows the structure resulting after the completion of these steps but prior to the removal of masking layer 66.

Referring now to FIG. 5b, masking layer 66 has been removed and a tungsten plug 58 has been formed in the antifuse aperture 64. The upper surfaces of the ILD layer 54 and the tungsten plug 58 may be planarized by employing CMP techniques or may be plasma etched using an oxygen-freon plasma, for example. FIG. 5B shows the structure resulting after planarization of the upper surface of ILD layer 54 and plug 58.

Referring now to FIG. 5c, the layer of SiC antifuse material 60 is then applied to the upper surfaces of ILD layer 54 and plug 58. Because the upper surfaces of the plug 58 and the ILD layer 54 are substantially planar, the layer of SiC antifuse material 60 may be applied by CVD techniques known in the art. After the layer of SiC antifuse material 60 has been applied, the second conductor 62 is formed from a material such as aluminum, copper, titanium, tungsten, or their alloys, titanium nitrides, or titanium oxides using sputtering techniques.

The second conductor 62 and the layer of SiC antifuse material 60 are then defined using standard photolithographic and etching techniques. A masking layer 70 is applied to define the second conductor 62 and antifuse material 60 layer. FIG. 5c shows the structure resulting after the etching step but prior to the removal of the masking layer 70 used to define the second conductor 62 and the layer of SiC antifuse material 60. After removal of the masking layer 70, the finished antifuse 50 structure is shown in FIG. 4. Those of ordinary skill in the art will recognize that the conventional passivation and contact layers present in all such structures are not shown in the figures.

Figure 6:
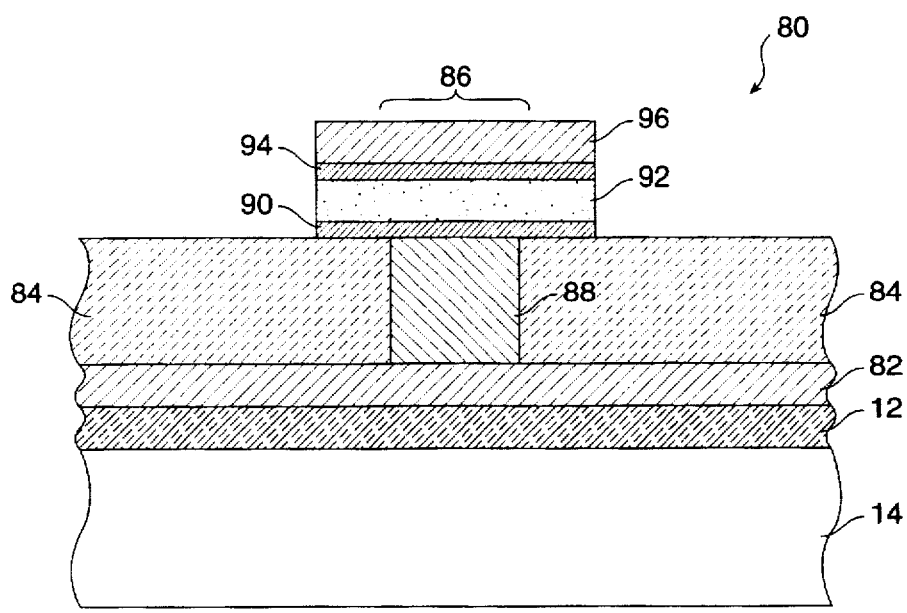
FIG. 6 is a cross-sectional view of an antifuse according to a fourth embodiment of the present invention.
Figure 7A:
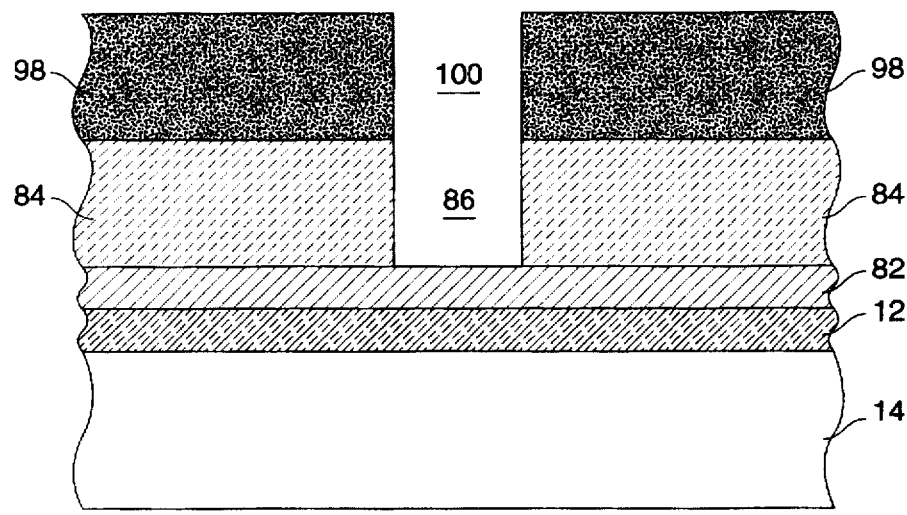
FIGS. 7a–7c are cross-sectional views of the antifuse of FIG. 6 after the completion of selected steps during its fabrication.
Figure 7B:
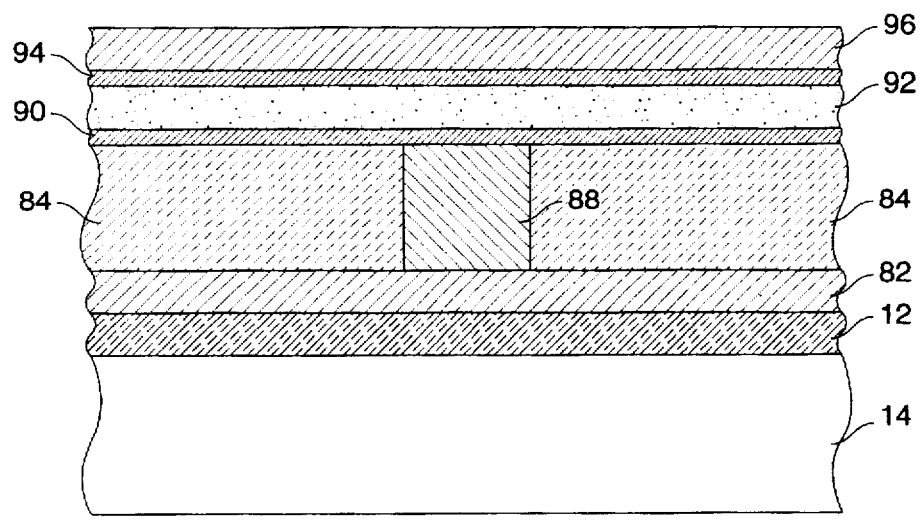
Figure 7C:
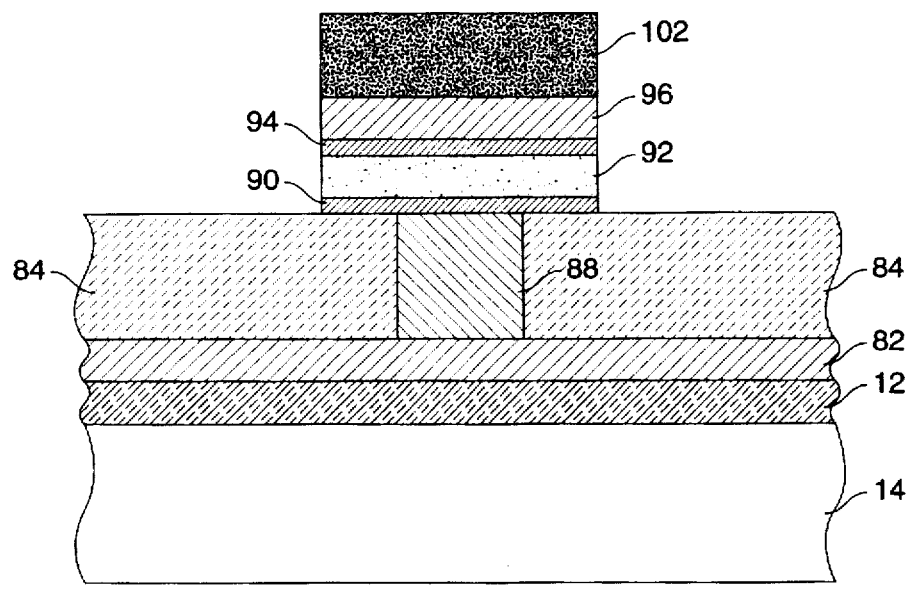

FIG. 6 is a cross-sectional view of an antifuse 80 according to the fourth embodiment of the present invention. FIGS. 7a–7c are cross-sectional views of the antifuse 80 of FIG. 6 after the completion of selected steps during its fabrication. The embodiment depicted in FIGS. 6 and 7a–7c is quite similar to the embodiment depicted in FIGS. 4 and 5a–5c except that layers of barrier metal isolate the layer of SiC antifuse material from the surrounding structures.

FIG. 6 shows antifuse 80 formed over an insulating layer 12 (typically an oxide) that is disposed on (or over one or more layers above) the surface of substrate 14. A first conductor 82, typically formed from aluminum, titanium, or tungsten alloys, is disposed on the upper surface of the insulating layer 12. An ILD layer 84, which may be formed from silicon dioxide, is disposed on the upper surface of first conductor 82. An aperture 86 is formed in the ILD layer 84 and is filled with a plug 88, typically formed from a material such as tungsten, or titanium alloys or nitride. The upper surfaces of the plug 88 and the ILD layer 84 are substantially planar. A first barrier metal layer 90 is disposed over the upper surfaces of the plug 88 and the ILD layer 84. A layer of SiC antifuse material 92 according to the present invention is disposed on the upper surface of the first barrier metal layer 90. A second barrier metal layer 94 is disposed on the upper surface of the layer of SiC antifuse material 92 and forms at least part of a second conductor. A second conductor 96 is shown in FIG. 6 forming the majority of the thickness of the second conductor.

Those of ordinary skill in the art will appreciate that the first and second barrier metal layers 90 and 94 are used to protect the antifuse material layer. Instances in which such layers may be employed would include tungsten, or titanium alloys or nitrides.

The fabrication steps used to form antifuse 80 may be seen with reference to FIGS. 7a–7c, which include cross-sectional views of the antifuse 80 of FIG. 6 after the completion of selected steps during its fabrication, to which attention is now drawn with reference initially to FIG. 7a. First, the lower or first conductor 82, formed from aluminum or titanium nitride using sputtering techniques, is deposited on the upper surface of insulating layer 12. As with the embodiment of FIG. 4, an etching step may be employed as is well known in the art to define the layer from which first conductor 82 is formed into various interconnect conductors and antifuse conductors.

Next, the ILD layer 84 is formed on the upper surface of first conductor 82 from a material such as silicon dioxide. Masking layer 98, having an opening 100 is applied to the surface of ILD layer 84 using conventional photolithography technology. An etching step is then performed to form aperture 86. FIG. 7a shows the structure resulting after the completion of these steps but prior to the removal of masking layer 98 used to define aperture 86.

Referring now to FIG. 7b, masking layer 98 has been removed, and a tungsten plug 88 has been formed in the aperture 86 using a thin titanium nitride adhesion promoting layer (not shown) as is known in the art. The upper surfaces of the ILD layer 84 and the tungsten plug 88 may be planarized by employing CMP techniques or may be plasma etched using an oxygen-freon plasma, for example. After planarization, first barrier layer 90 is formed from a material such as titanium nitride using sputtering techniques.

Because the upper surfaces of the plug 88 and the ILD 84, and the first barrier layer 90 are substantially planar, the layer of SiC antifuse material 92 may be applied by CVD techniques. After the layer of SiC antifuse material 92 has been applied, the second barrier metal layer 94 is formed on its upper surface from a material such as titanium nitride using sputtering techniques. The second conductor 96 is then formed on the upper surface of the second barrier metal layer 94 from a material such as aluminum using sputtering techniques. FIG. 7b shows the structure resulting after formation of second conductor 96 has been completed.

Referring now to FIG. 7c, the second conductor 96, second barrier metal layer 94, and the layer of SiC antifuse material 92 are then defined. A masking layer 102 is applied using standard photolithographic and etching techniques. FIG. 7c shows the structure resulting after the etching step but prior to the removal of the masking layer 102 used to define the sandwich structure comprising second conductor 96, second barrier metal layer 94 and the layer of SiC antifuse material 92. After removal of the masking layer 102, the finished antifuse structure is shown in FIG. 6. As with the earlier drawing figures, those of ordinary skill in the art will recognize that the conventional passivation and contact layers present in all such microcircuit structures are not shown in FIG. 6.

Figure 8:
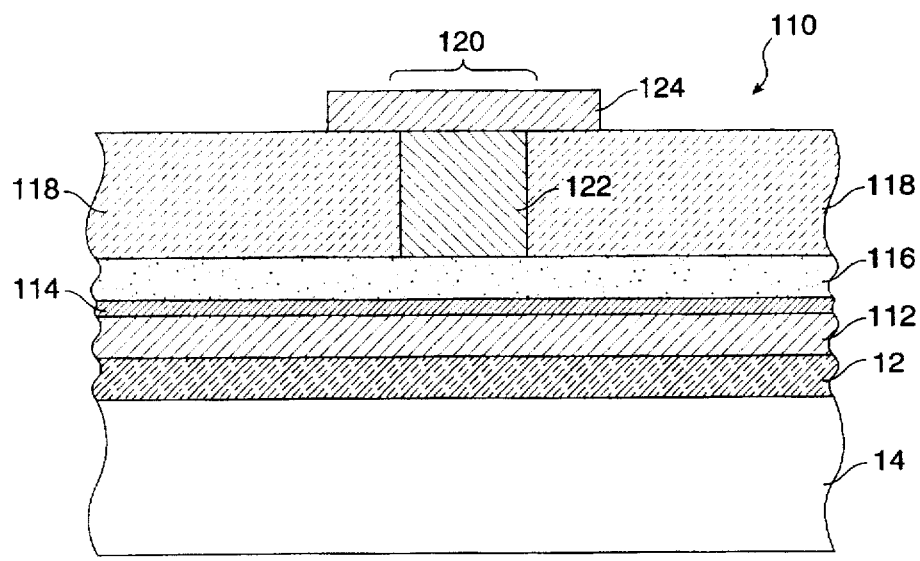
FIG. 8 is a cross-sectional view of an antifuse according to a fifth embodiment of the present invention.

FIG. 8 is a cross-sectional view of an antifuse 110 according to a fifth embodiment of the present invention. The antifuse embodiment depicted in FIGS. 8 and 9a–9c, as well as the related embodiment depicted in FIGS. 10 and 11a–11c, is also a stacked antifuse structure, however, those of ordinary skill in the art will realize that it is somewhat inverted from the antifuse embodiments of those figures since the layer of SiC antifuse material is positioned under the ILD layer.

Referring now to FIG. 8, antifuse 110 is formed over an insulating layer 12 (typically an oxide) disposed on (or over one or more layers above) the surface of substrate 14. A first conductor 112, typically formed from aluminum, is disposed on the upper surface of the insulating layer 12. A barrier metal layer 114 is disposed on the upper surface of first conductor 112. A layer of SiC antifuse material 116 according to the present invention is disposed over the upper surfaces of the barrier metal layer 114. An ILD layer 118, which may be formed from silicon dioxide, is disposed on the upper surface of the layer of SiC antifuse material 116. An aperture 120 is formed in the ILD layer 118 and is filled with a plug 122, that is typically formed from a material such as tungsten. The upper surfaces of the plug 122 and the ILD layer 118 are substantially planar. A second conductor 124 is disposed on the upper surfaces of the ILD layer 118 and the plug 122.

Figure 9A:
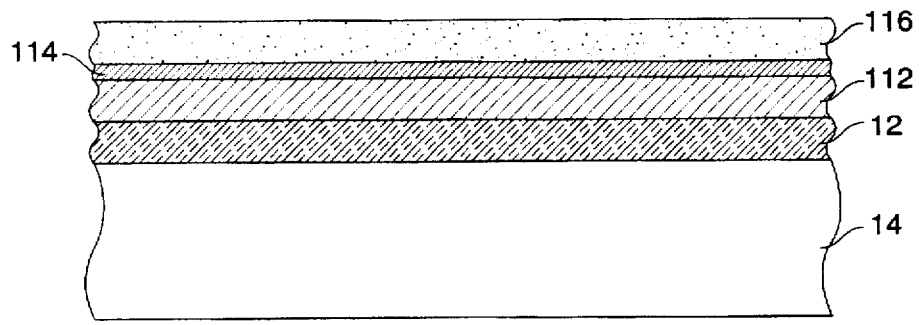
FIGS. 9a–9c are cross-sectional views of the antifuse of FIG. 8 after the completion of selected steps during its fabrication.
Figure 9B:
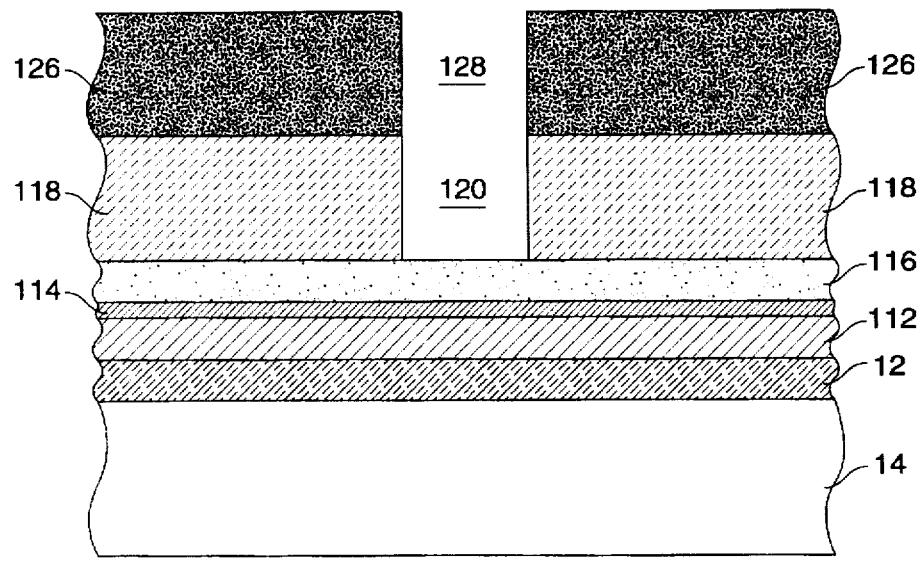
Figure 9C:
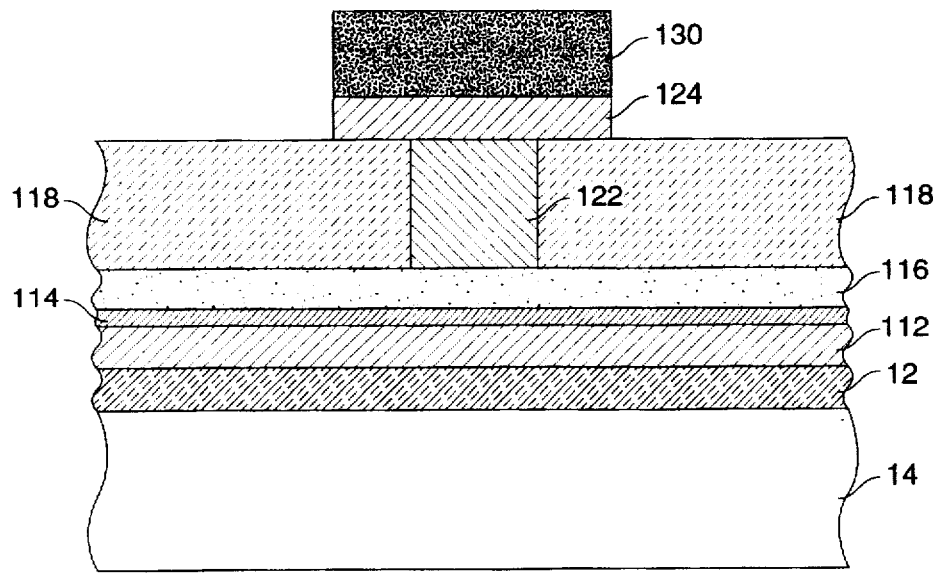

The fabrication steps used to form antifuse 110 may be seen with reference to FIGS. 9a–9c, which include cross-sectional views of the antifuse 110 of FIG. 8 after the completion of selected steps during its fabrication, and to which attention is now drawn with reference initially to FIG. 9a. First, the lower or first conductor 112, formed from aluminum using sputtering techniques, is deposited on the upper surface of insulating layer 12. A barrier metal layer 114 is formed on the upper surface of first conductor 112. An etching step (not illustrated) may be employed as is well known in the art to define the composite layers from which first conductor 112 and barrier metal layer 114 are formed into various interconnect conductors and antifuse conductors. The layer of SiC antifuse material 116 is then formed on the upper surface of barrier metal layer 114. FIG. 9a shows the structure resulting after the completion of these steps.

Referring now to FIG. 9b, the ILD layer 118 is formed on the upper surface of antifuse material 116 from a material such as silicon dioxide. A conventional masking step is used to apply masking layer 126 having opening 128. A conventional etching step is performed to form aperture 120. FIG. 9b shows the structure resulting after the completion of these steps but prior to the removal of masking layer 126 used to define aperture 120.

Referring now to FIG. 9c, masking layer 126 has been removed and a tungsten plug 122 has been formed in the aperture 120. As with the prior-disclosed embodiments, the upper surfaces of the ILD layer 118 and the tungsten plug 122 may be planarized by employing CMP techniques or may be plasma etched using an oxygen-freon plasma, for example. The second conductor 124 is then formed from a material such as aluminum using sputtering techniques.

The second conductor 124 is then defined using standard photolithographic and etching techniques. A masking layer 130, applied using standard photolithographic techniques, is used to define second conductor 124 as is known in the art. FIG. 9c shows the structure resulting after the etching step but prior to the removal of the masking layer 130 used to define the second conductor 124. After removal of the masking layer 130, the finished antifuse structure 110 is shown in FIG. 8. Those of ordinary skill in the art will recognize that the conventional passivation and contact layers present in all such structures are not shown in the figures.

Figure 10:
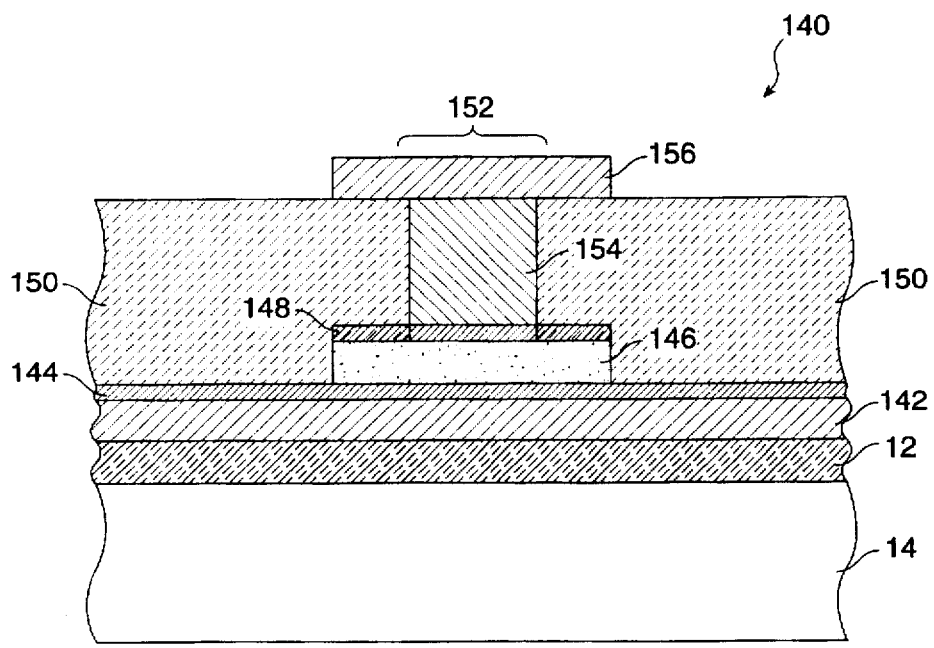
FIG. 10 is a cross-sectional view of an antifuse according to a sixth embodiment of the present invention.

Referring now to FIG. 10, an inverted-stack antifuse embodiment similar to that of FIG. 8 is depicted. Antifuse 140 is formed over an insulating layer 12 (typically an oxide) disposed on (or over one or more layers above) the surface of substrate 14. A first conductor 142, typically formed from aluminum, is disposed on the upper surface of the insulating layer 12. A first barrier metal layer 144 is disposed on the upper surface of first conductor 142. A layer of SiC antifuse material 146 according to the present invention is disposed over the upper surfaces of the barrier metal layer 144. A second barrier layer 148 is disposed on the upper surface of the layer of SiC antifuse material 146. An ILD layer 150, which may be formed from silicon dioxide, is disposed on the upper surface of the layer of second barrier layer 148. An aperture 152 is formed in the ILD layer 150, and is filled with a plug 154 that is typically formed from a material such as tungsten. The upper surfaces of the plug 154 and the ILD layer 150 are substantially planar. A second conductor 156 is disposed on the upper surfaces of the ILD layer 150 and the plug 154.

Figure 11A:
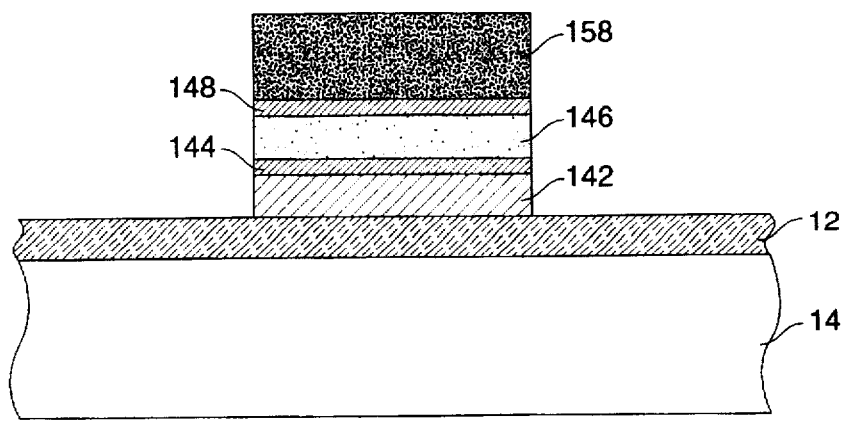
FIGS. 11a–11c are cross-sectional views of the antifuse of FIG. 10 after the completion of selected steps during its fabrication.
Figure 11B:
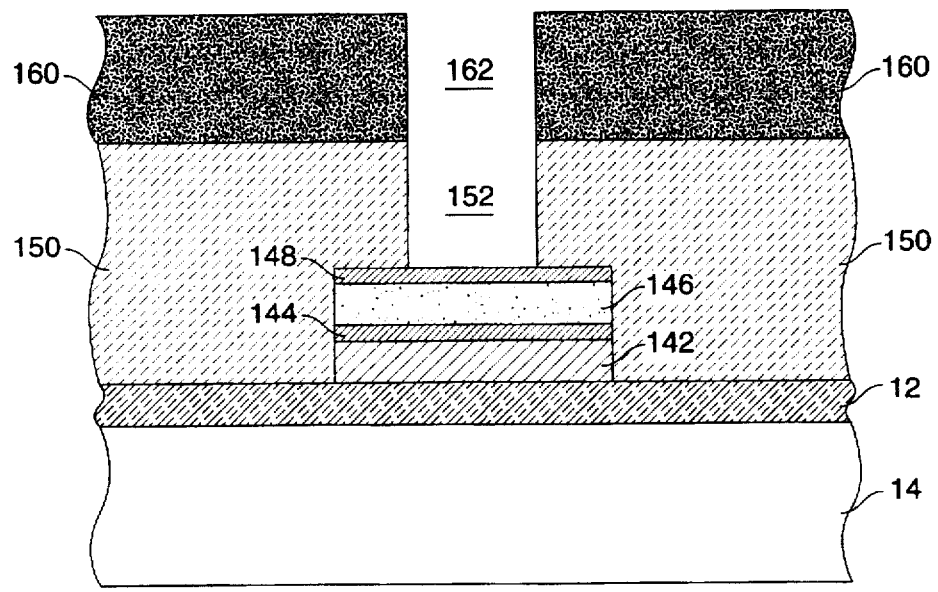
Figure 11C:
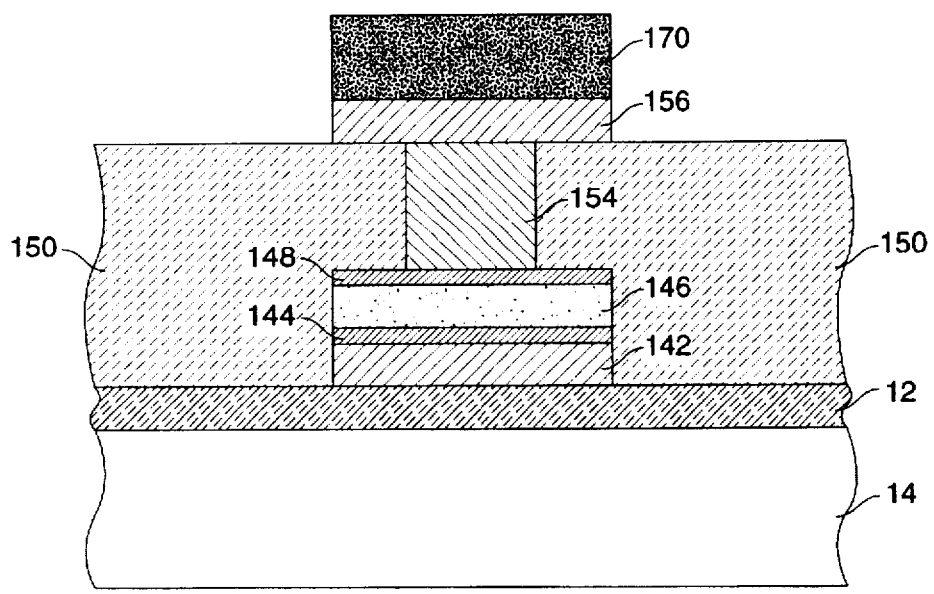

The fabrication steps used to form antifuse 140 may be seen with reference to FIGS. 11a–11c, which include cross-sectional views of the antifuse 140 of FIG. 10 after the completion of selected steps during its fabrication, and to which attention is now drawn with reference initially to FIG. 11a. First, the lower or first conductor 142, formed from aluminum using sputtering techniques, is deposited on the upper surface of insulating layer 12. A first barrier metal layer 144 is formed on the upper surface of first conductor 142. An etching step (not shown) may be employed as is well known in the art to define the composite layers from which first conductor 142 and first metal barrier layer 144 are formed into various interconnect conductors and antifuse conductors. The layer of SiC antifuse material 146 is then formed on the upper surface of first barrier metal layer 144. A second barrier layer 148 is then formed on the upper surface of antifuse material 146. The stack comprising the second barrier layer 148 and the antifuse material layer 146 is then defined using masking layer 158 and conventional etching steps. FIG. 11a shows the structure resulting after the completion of these steps but prior to the removal of masking layer 158.

Referring now to FIG. 11b, masking layer 158 has been removed and the ILD layer 150 is formed on the upper surface of the defined stack comprising second barrier layer 148, the antifuse material layer 146 and the first barrier metal layer 144. A masking layer 160 having a mask opening 162 is formed over the surface of the ILD layer 150 using conventional photolithography techniques. A conventional etching step is performed to form an aperture 152 in ILD layer 150. FIG. 11b shows the structure resulting from a completion of these steps but prior to the removal of masking layer 160 used to define aperture 152.

Referring now to FIG. 11c, masking layer 160 has been removed and a tungsten plug 154 has been formed in the aperture 152. As with the prior-disclosed embodiments, the upper surfaces of the ILD layer 150 and the tungsten plug 154 may be planarized by employing CMP techniques or may be plasma etched using an oxygen-freon plasma, for example. The second conductor 156 is then formed from a material such as titanium nitride, using sputtering techniques.

The second conductor 156 is then defined using standard photolithographic and etching techniques. A masking layer 170 is applied, exposed, and developed using conventional photolithography techniques. A conventional etching step is then performed to define second conductor 156. FIG. 11c shows the structure resulting after the etching step but prior to removal of the masking layer 170. After removal of the masking layer 170 used to define the second conductor 156, the finished antifuse 140 structure is shown in FIG. 10. Those of ordinary skill in the art will recognize that the conventional passivation and contact layers present in all such structures are not shown in the figures.

Those of ordinary skill in the art will recognize that the thicknesses of the various corresponding layers in the different embodiments of the antifuse structures disclosed herein may be similar. Such skilled persons will also understand that the thicknesses called out for various ones of the layers in the antifuse structures disclosed herein will be known for use in prior antifuse and similar non-antifuse microcircuit structures. The recitations herein of layer thicknesses are therefore not to be taken as limiting, but only as illustrative.

With those understandings in mind, the first conductors of the antifuses disclosed herein may have thicknesses of from about 5,000 angstroms to about 1 micron. The antifuse layers may have thicknesses ranging from about 500 angstroms to about 1,500 angstroms for practical integrated circuits, and larger thicknesses for applications such as programmable printed circuit boards or the like, the individual thickness of any antifuse depending of course on the desired programming voltage. With the thickness range set forth herein, the programming voltages should be about 10.5 volts.

The interlayer dielectric thicknesses may typically be in the range from about 5,000 angstroms to about 1.5 microns. Antifuse vias may have aperture areas as small as 0.4 microns on each side or greater. Upper conductor thicknesses are typically about 1 micron or greater. Finally, barrier layer thicknesses are typically 2,000 angstroms thick, since their purpose is to prevent aluminum or other metals from the conductors from diffusing into the antifuse material layer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An antifuse comprising:

a first electrode;

an antifuse material formed from a solid silicon carbide material, said silicon carbide material having a carbide to silicon ratio of between about 1:1 and about 1:100, said antifuse material disposed over said first electrode; and a second electrode disposed over said antifuse material.

2. An antifuse, according to claim 1, wherein said silicon carbide material is stable at temperatures below about 350° C. and has a resistivity of greater than about $10^{12}$ ohm-cm.

3. An antifuse comprising, a first electrode;

an interlayer dielectric disposed over said first electrode and having an antifuse via formed therein;

an antifuse material formed from a solid silicon carbide material, said silicon carbide material having a carbide to silicon ratio of between about 1:1 and about 1:100, said antifuse material disposed in said antifuse via and over said first electrode; and a second electrode disposed over said antifuse material.

4. An antifuse, according to claim 3, wherein said silicon carbide material is stable at temperatures below about 350° C. and has a resistivity of greater than about $10^{12}$ ohm-cm.

5. An antifuse comprising:

a first electrode;

an interlayer dielectric formed over said first electrode and having an antifuse via formed therein;

a conductive plug disposed in said antifuse via and planarized with an upper surface of said interlayer dielectric;

an antifuse material formed from a solid silicon carbide material, said silicon carbide material having a carbide to silicon ratio of between about 1:1 and about 1:100, said antifuse material disposed over said conductive plug; and a second electrode disposed over said antifuse material.

6. An antifuse, according to claim 5, further comprising a barrier layer formed over said antifuse material.

7. An antifuse, according to claim 5, wherein said silicon carbide material is stable at temperatures below about 350° C. and has a resistivity of greater than about $10^{12}$ ohm-cm.

8. An antifuse comprising:

a first electrode;

a barrier layer disposed over said first electrode;

an antifuse material disposed over said barrier layer, said antifuse material formed from a solid silicon carbide material, said silicon carbide material having a carbide to silicon ratio of between about 1:1 and about 1:100;

an interlayer dielectric formed over said antifuse material and having an antifuse via formed therein;

a conductive plug disposed in said antifuse via and in contact with said antifuse material; and a second electrode disposed over said conductive plug.

9. An antifuse, according to claim 8, wherein said silicon carbide material is stable at temperatures below about 350° C. and has a resistivity of greater than about $10^{12}$ ohm-cm.

10. An antifuse comprising:

a first electrode;

a first barrier layer disposed over said first electrode;

an antifuse material disposed over said first barrier layer, said antifuse material formed from a solid silicon carbide material, said silicon carbide material having a carbide to silicon ratio of between about 1:1 and about 1:100;

a second barrier layer disposed over said antifuse material;

an interlayer dielectric formed over said second barrier layer and having an antifuse via formed therein;

a conductive plug disposed in said antifuse via and in contact with said second barrier layer; and a second electrode disposed over said conductive plug.

11. An antifuse, according to claim 10, wherein said silicon carbide material is stable at temperatures below about 350° C. and has a resistivity of greater than about $10^{12}$ ohm-cm.

* * * * *

UNITED STATES PATENT AND TRADEMARK OFFICE
CERTIFICATE OF CORRECTION

PATENT NO. : 5,789,764
DATED : August 4, 1998
INVENTOR(S) : John L. McCollum

It is certified that error appears in the above-identified patent and that said Letters Patent is hereby corrected as shown below:

---At column 2, line 54, replace "increase" with --increased--.

---At column 3, line 60, after "dielectric" insert --,--.

---At column 4, line 7, after "," insert -- --.

---At column 12, line 50, replace "comprising," with --comprising:--.

Signed and Sealed this

Twenty-ninth Day of December, 1998

Attest:

BRUCE LEHMAN

*Attesting Officer*   *Commissioner of Patents and Trademarks*